United States Patent
Cho et al.

(10) Patent No.: US 12,550,653 B2
(45) Date of Patent: Feb. 10, 2026

(54) SUBSTRATE PROCESSING DEVICE AND METHOD FOR OPERATING THE SAME

(71) Applicant: SAMSUNG ELECTRONICS CO., LTD., Suwon-si (KR)

(72) Inventors: Won Keun Cho, Suwon-si (KR); Dong Hoon Kwon, Suwon-si (KR); Ki Hoon Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 282 days.

(21) Appl. No.: 18/353,293

(22) Filed: Jul. 17, 2023

(65) Prior Publication Data

US 2024/0234164 A1 Jul. 11, 2024

(30) Foreign Application Priority Data

Jan. 6, 2023 (KR) .................. 10-2023-0002062

(51) Int. Cl.
*H01L 21/321* (2006.01)
*B24B 37/015* (2012.01)
*H01L 21/67* (2006.01)
*H01L 21/677* (2006.01)

(52) U.S. Cl.
CPC ........ *H01L 21/3212* (2013.01); *B24B 37/015* (2013.01); *H01L 21/67046* (2013.01); *H01L 21/67103* (2013.01); *H01L 21/67219* (2013.01); *H01L 21/67248* (2013.01); *H01L 21/67706* (2013.01)

(58) Field of Classification Search
CPC .......... H01L 21/3212; H01L 21/67046; H01L 21/67103; H01L 21/67219; H01L 21/67248; H01L 21/67706; H01L 21/67092; B24B 37/015; B24B 55/06
See application file for complete search history.

(56) References Cited

U.S. PATENT DOCUMENTS

| | | | |
|---|---|---|---|
| 6,224,461 B1 * | 5/2001 | Boehm, Jr. ........... | B24B 37/015 451/7 |
| 6,540,841 B1 * | 4/2003 | Roy ........................ | B08B 1/34 134/6 |
| 6,896,586 B2 | 5/2005 | Pham et al. | |
| 7,201,634 B1 | 4/2007 | Naujok et al. | |
| 8,172,641 B2 | 5/2012 | Ho et al. | |
| 10,058,975 B2 | 8/2018 | Brown | |
| 2007/0184759 A1 * | 8/2007 | Lee ........................ | B24B 37/12 451/41 |

(Continued)

FOREIGN PATENT DOCUMENTS

| KR | 10-0224726 | | 7/1999 |
|---|---|---|---|
| KR | 20030059639 A | * | 7/2003 |

(Continued)

*Primary Examiner* — Jeffrie R Lund
(74) *Attorney, Agent, or Firm* — MORGAN, LEWIS & BOCKIUS LLP

(57) ABSTRACT

A substrate processing device includes a platen, a polishing pad disposed on the platen, a first rotating body, a second rotating body spaced apart from the first rotating body, a caterpillar module disposed on a portion of the polishing pad and engaged with the first rotating body and the second rotating body, and a temperature controller thermally connected to the caterpillar module.

20 Claims, 17 Drawing Sheets

(56) References Cited

U.S. PATENT DOCUMENTS

| | | | |
|---|---|---|---|
| 2012/0167924 A1* | 7/2012 | Chen | B24B 53/017 |
| | | | 134/33 |
| 2016/0121452 A1 | 5/2016 | Takahashi | |
| 2020/0164486 A1* | 5/2020 | Che | B24B 53/017 |
| 2020/0376523 A1 | 12/2020 | Wu et al. | |
| 2024/0234164 A1* | 7/2024 | Cho | H01L 21/67248 |

FOREIGN PATENT DOCUMENTS

| | | | | |
|---|---|---|---|---|
| KR | 20090074555 A | * | 7/2009 | B24B 37/04 |
| KR | 20110016703 A | * | 2/2011 | H01L 21/30625 |
| WO | WO-03094216 A1 | * | 11/2003 | C09G 1/02 |

\* cited by examiner

104

IV

SUBSTRATE PROCESSING DEVICE AND METHOD FOR OPERATING THE SAME

CROSS-REFERENCE TO RELATED APPLICATION

This application claims priority under 35 U.S.C. § 119 to Korean Patent Application No. 10-2023-0002062, filed on Jan. 6, 2023, in the Korean Intellectual Property Office, the disclosure of which is herein incorporated by reference in its entirety.

BACKGROUND

Technical Field

The present disclosure relates to a substrate processing device and a method for operating the same.

Discussion of Related Art

In a semiconductor device manufacturing process, chemical mechanical polishing (CMP) processes have been widely used as a planarization technique. The planarization technique removes a step difference between films formed on a substrate. The chemical mechanical polishing process can efficiently planarize the films formed on the substrate by injecting a polishing slurry containing polishing particles between the substrate and a polishing pad and rubbing the substrate with the polishing pad.

SUMMARY

Some aspects of the present disclosure provide a substrate processing device having improved product reliability in a chemical mechanical polishing process.

Some aspects of the present disclosure provide a method for operating a substrate processing device having improved product reliability in a chemical mechanical polishing process.

Aspects of the present disclosure are not limited to those mentioned above and additional aspects of the present disclosure, which are not mentioned herein, will be clearly understood by those skilled in the art from the following description of the present disclosure.

According to some aspects of the present disclosure, there is provided a substrate processing device including a platen, a polishing pad disposed on the platen, a first rotating body, a second rotating body spaced apart from the first rotating body, and a caterpillar module disposed on a portion of the polishing pad, engaged with the first rotating body and the second rotating body, and extending outside of an outer circumferential surface of the platen.

According to some aspects of the present disclosure, there is provided a substrate processing device including a platen, a polishing pad disposed on the platen, a first rotating body, a second rotating body spaced apart from the first rotating body, a caterpillar module disposed on a portion of the polishing pad and engaged with the first rotating body and the second rotating body, and a temperature controller thermally connected to the caterpillar module.

According to some aspects of the present disclosure, there is provided a method for operating a substrate processing device comprising a platen, a polishing pad disposed on the platen, a first rotating body, a second rotating body spaced apart from the first rotating body, and a caterpillar module disposed on a portion of the polishing pad and engaged with the first rotating body and the second rotating body, the method comprising rotating first rotating body and the second rotating body to rotate the caterpillar module, rotating the polishing pad, transferring heat to the caterpillar module, and transferring heat to a surface of the polishing pad by the caterpillar module.

It should be noted that effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail illustrative embodiments thereof with reference to the attached drawings, in which.

DETAILED DESCRIPTION

Hereinafter, embodiments according to technical aspects of the present disclosure will be described in detail with reference to the accompanying drawings.

In a chemical mechanical polishing process, a polishing temperature may cause a change polishing characteristics of the chemical mechanical polishing process. Embodiments of the present disclosure are directed to a hardware module capable of efficiently controlling the polishing temperature. According to some embodiments, polishing characteristics may be effectively controlled.

Figure 1:
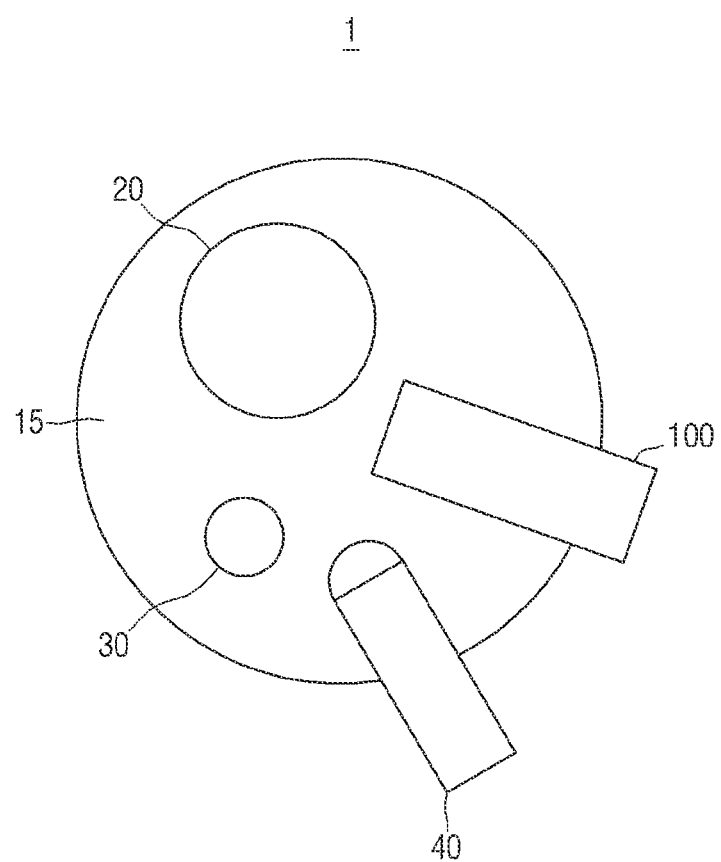
FIG. 1 is a plan view illustrating a substrate processing device according to some embodiments.
Figure 2:
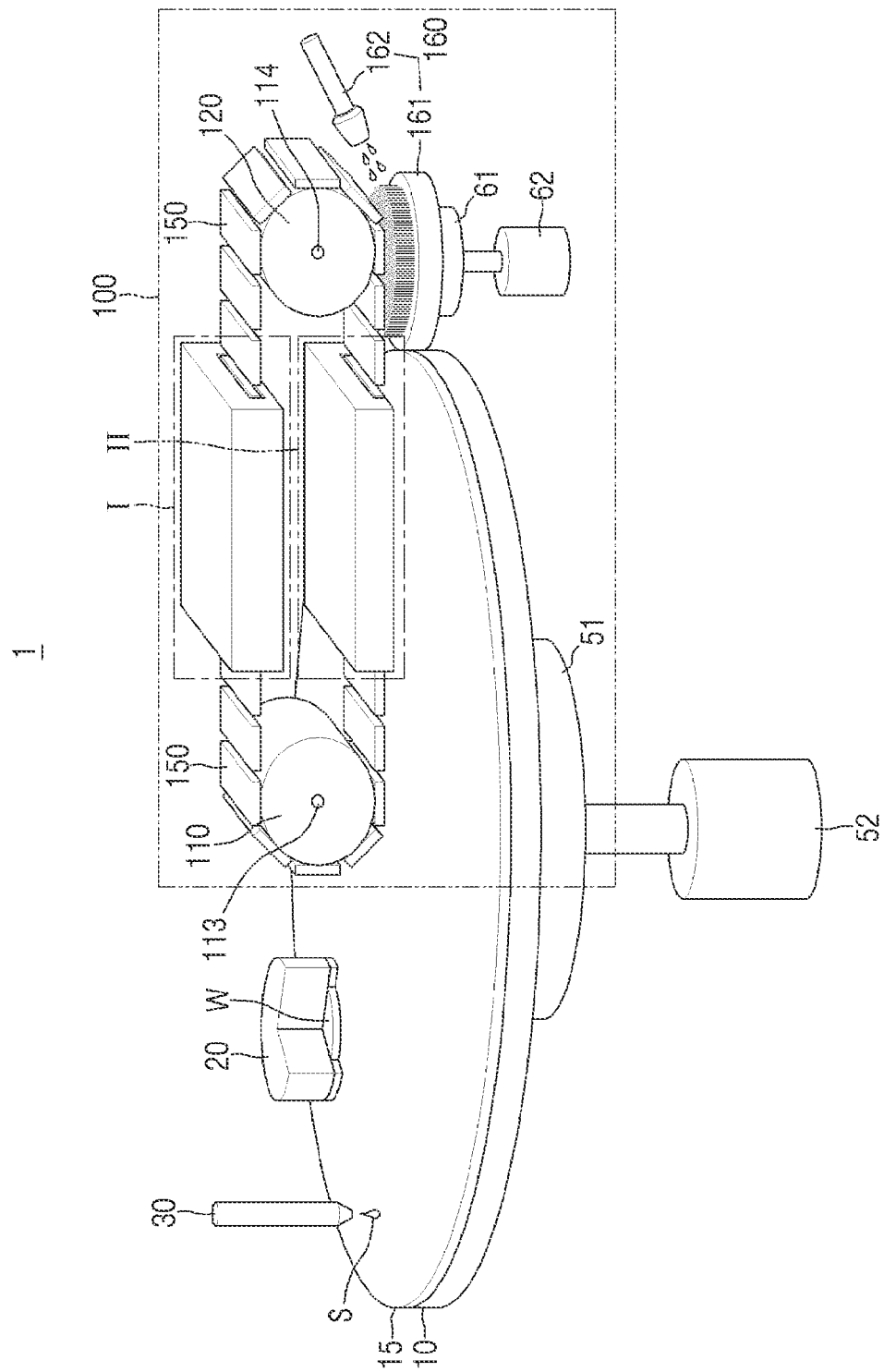
FIG. 2 is a side view illustrating a substrate processing device according to some embodiments.

FIG. 1 is a plan view illustrating a substrate processing device according to some embodiments. FIG. 2 is a side view illustrating a substrate processing device according to some embodiments.

Referring to FIG. 1 and FIG. 2, a substrate processing device 1 according to some embodiments may include a platen 10, a polishing pad 15, a carrier head 20, a slurry supply unit 30, a pad conditioner 40, a first temperature controller 100 and a cleaning module 160.

The platen 10 may be rotatable. The polishing pad 15 may be disposed on the platen 10. The platen 10 may rotate the polishing pad 15 disposed thereon. For example, a first driving shaft 51 may be connected to a lower portion of the platen 10, and the first driving shaft 51 may rotate by receiving a rotational power from a first motor 52. The platen 10 may rotate the polishing pad 15 based on a rotational motion at least the first driving shaft 51. The rotational motion of the first driving shaft 51 may be perpendicular to an upper surface of the platen 10.

The polishing pad 15 may be disposed on the platen 10 as shown in FIG. 2. The polishing pad 15 may be provided as a plate, for example, a circular plate, but is not limited thereto. The polishing pad 15 may have a predetermined thickness. The polishing pad 15 may include a polishing surface. The polishing surface may have a predetermined roughness. While a chemical mechanical polishing process is being performed, the polishing surface of the polishing pad 15 may polish a wafer W in contact with the polishing pad 15.

The polishing pad 15 may include a porous material having a plurality of microspaces. For example, the polishing pad 15 may include a polyurethane pad, but is not limited thereto. The microspaces of the polishing pad 15 may accommodate a polishing slurry S provided while the chemical mechanical polishing process is being performed.

In some embodiments, the polishing pad 15 may further include an electrically conductive material. In an embodiment in which the polishing pad 15 includes an electrically conductive material, the polishing pad 15 may be grounded to prevent a short from occurring. In some other embodiments, the polishing pad 15 may be a non-conductor.

The carrier head 20 may be disposed adjacent to the polishing pad 15. The carrier head 20 may be disposed on the polishing pad 15. As shown in FIG. 2, the carrier head 20 may provide the wafer W onto the polishing pad 15. The carrier head 20 may hold the wafer W against the polishing pad 15. The carrier head 20 may independently control polishing parameters related to each wafer W. For example, the carrier head 20 may independently control, for example, a pressure of the wafer W against the polishing pad 15.

The slurry supply unit 30 may be disposed adjacent to the polishing pad 15. The slurry supply unit 30 may be disposed above the polishing pad 15. The slurry supply unit 30 may supply the polishing slurry S onto the polishing pad 15. The slurry supply unit 30 may supply the polishing slurry S onto the polishing pad 15 while the chemical mechanical polishing process is being performed. The polishing slurry S may include slurry compositions for the chemical mechanical polishing. For example, the polishing slurry S may include polishing particles, an oxidizing agent, a pH adjusting agent, a temperature sensitive agent and a solvent.

The pad conditioner 40 may be disposed adjacent to the polishing pad 15. The pad conditioner 40 may perform a conditioning process for the polishing pad 15. The pad conditioner 40 may maintain the polishing surface of the polishing pad 15 so that the wafer W is effectively polished while the chemical mechanical polishing process is being performed.

The first temperature controller 100 may be disposed on the polishing pad 15. The first temperature controller 100 may control the polishing temperature. The first temperature controller 100, which may control the polishing temperature, may be capable of changing polishing characteristics of the chemical mechanical polishing process while the chemical mechanical polishing process for the wafer W is being performed. For example, the first temperature controller 100 may increase or decrease a temperature of a surface of the polishing pad 15. Alternatively, for example, the first temperature controller 100 may be connected to the slurry supply unit 30 to increase or decrease a temperature of the polishing slurry S supplied from the slurry supply unit 30.

The cleaning module 160 may be disposed outside the polishing pad 15 as shown in FIG. 2. The cleaning module 160 may remove contaminants (e.g., waste slurry, pad debris, polishing process byproducts, etc.) generated while the chemical mechanical polishing process is being performed. The cleaning module 160 may remove contaminants before a surface of the first temperature controller 100 in contact with the first temperature controller 100 is contaminated or the contaminants are solidified.

In some embodiments, the cleaning module 160 may include a brush unit 161 and a spray unit 162. The brush unit 161 may be disposed adjacent to the polishing pad 15. The brush unit 161 may be disposed on an outer circumferential surface of the polishing pad 15. In addition, the brush unit 161 may be in contact with the first temperature controller 100. The brush unit 161 may be disposed below the first temperature controller 100. In some embodiments, the brush unit 161 may be rotatable. For example, the brush unit 161 may rotate by receiving a rotational power from a second driving shaft 61 and a second motor 62. The second driving shaft 61 and the second motor 62 may be connected to a lower portion of the brush unit 161. The spray unit 162 may be disposed adjacent to the first temperature controller 100 and the brush unit 161. The spray unit 162 may clean the first temperature controller 100 by spraying a cleaning chemical agent or DI water to effectively remove the contaminants.

Figure 3:
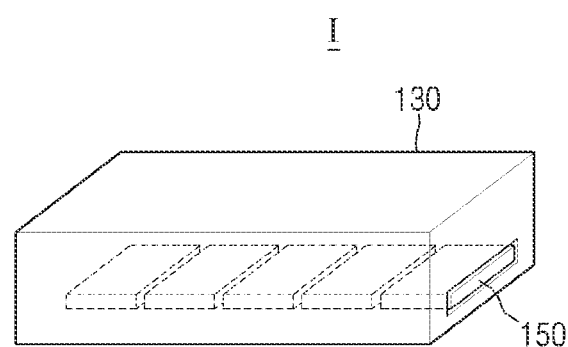
FIG. 3 is an enlarged view of a first region I of FIG. 2.
Figure 4:
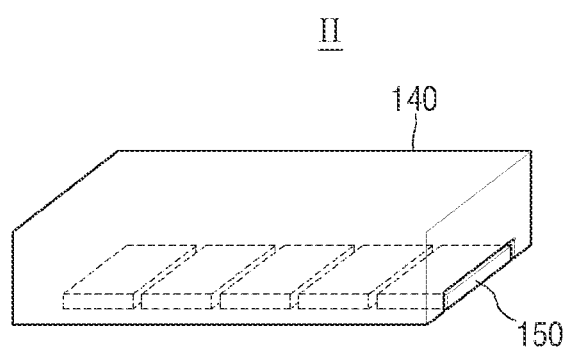
FIG. 4 is an enlarged view illustrating a second region II of FIG. 2.
Figure 5:
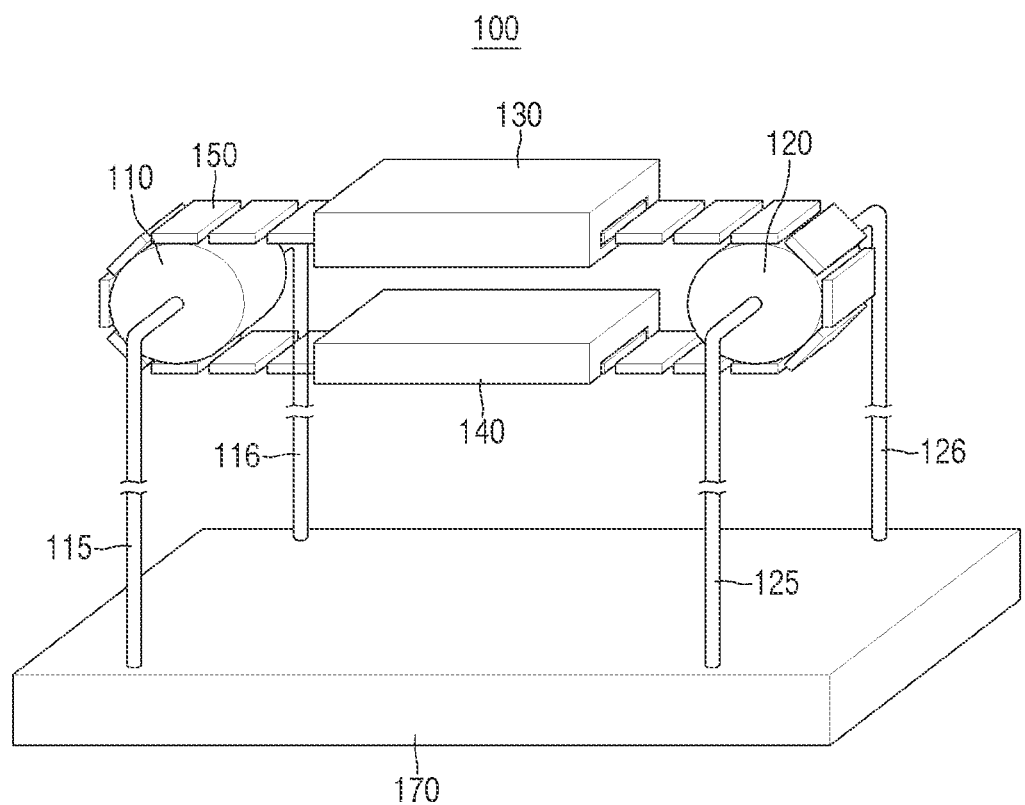
FIG. 5 is a view illustrating a rotating body and a fluid supplier according to some embodiments.
Figure 6:
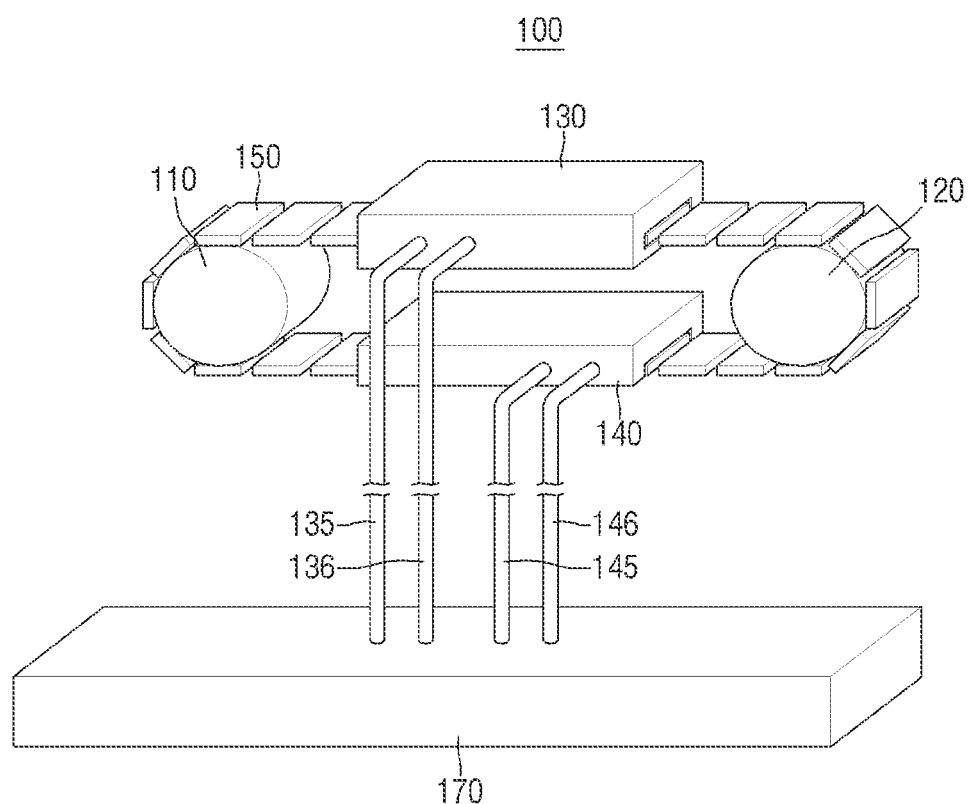
FIG. 6 is a conceptual view illustrating a heat transfer module and a fluid supplier according to some embodiments.

FIG. 3 is an enlarged view of a first region I of FIG. 2. FIG. 4 is an enlarged view illustrating a second region II of FIG. 2. FIG. 5 is a view illustrating a rotating body and a fluid supplier according to some embodiments. FIG. 6 is a conceptual view illustrating a heat transfer module and a fluid supplier according to some embodiments.

Referring to FIG. 2, FIG. 3, and FIG. 4, the first temperature controller 100 may include a first rotating body 110, a second rotating body 120, a first region I, a second region II, a first heat transfer module 130 and a second heat transfer module 140. The first temperature controller 100 may further include a caterpillar module 150.

As shown in FIG. 2, the caterpillar module 150 may operate as a conveyer belt. The caterpillar module 150 may rotate while being engaged with the first rotating body 110 and the second rotating body 120 by rotation of the first rotating body 110 and the second rotating body 120. The first rotating body 110 and the second rotating body 120 may be spaced apart from each other. The first rotating body 110 may rotate about a first rotational shaft 113, which may be disposed through a central portion of the first rotating body 110 along a longitudinal axis of the first rotating body 110. The second rotating body 120 may rotate about a second rotational shaft 114, which may be disposed through a central portion of the second rotating body 120 along a longitudinal axis of the second rotating body 120. In this case, the first rotating body 110, the second rotating body 120 and the caterpillar module 150 may rotate in a state that their positions are fixed. In addition, the first rotating body 110, the second rotating body 120 and the caterpillar module 150 may rotate in the same direction when they rotate. That is, the first rotating body 110, the second rotating body 120 and the caterpillar module 150 may be engaged with one another.

As shown in FIG. 3 and FIG. 4, in some embodiments, the caterpillar module 150 may be in contact with the first heat transfer module 130 in the first region I and the second heat transfer module 140 in the second region II. The caterpillar module 150 may be thermally connected to the first heat transfer module 130 of the first temperature controller 100 in the first region I and the second heat transfer module 140 of the first temperature controller 100 in the second region II. For example, as shown in FIG. 3, the caterpillar module 150 may be in contact with the first heat transfer module 130 in the first region I. All of four sides of the caterpillar module 150 may be surrounded by the first heat transfer module 130. In addition, as shown in FIG. 4, the caterpillar module 150 may be in contact with the second heat transfer module 140 in the second region II. Three sides of the caterpillar module 150 may be surrounded by the second heat transfer module 140, while one side of the caterpillar module 150 may be in contact with the polishing pad 15.

Referring to FIG. 2 and FIG. 5, the first rotating body 110 may be connected to a fluid supplier 170 through a first supply unit 115. According to some embodiments, the fluid supplier 170 may supply a temperature-controlling fluid to the first rotating body 110 through the first supply unit 115. The first rotating body 110 may be heated or cooled by being supplied with the temperature-controlling fluid. As shown in FIG. 2, a surface of the caterpillar module 150 may be also heated or cooled by being engaged with, and thermally connected to, the first rotating body 110 of the first temperature controller 100. In addition, the caterpillar module 150, which may be heated or cooled, may be thermally connected to the polishing pad 15 in contact with the polishing pad (15 in FIG. 2) while rotating, whereby the polishing pad 15 may be heated or cooled by thermal conduction.

In addition, the first rotating body 110 may be connected to the fluid supplier 170 through a first discharge unit 116. According to some embodiments, the first rotating body 110 may discharge the temperature-controlling fluid to the fluid supplier 170 through the first discharge unit 116. That is, the first rotating body 110 may control the temperature by using the temperature-controlling fluid during the chemical mechanical polishing process and discharge the temperature-controlling fluid back to the fluid supplier 170. The first temperature controller 100 may include the fluid supplier 170, the first supply unit 115, the first rotating body 110 and the first discharge unit 116. The fluid supplier 170, the first supply unit 115, the first rotating body 110 and the first discharge unit 116 may form a first temperature-controlling fluid circuit, which may transfer heat to or from the caterpillar module 150 and the polishing pad 15.

The second rotating body 120 may be connected to the fluid supplier 170 through a second supply unit 125. According to some embodiments, the fluid supplier 170 may supply the temperature-controlling fluid to the second rotating body 120 through the second supply unit 125. The second rotating body 120 may be heated or cooled by being supplied with the temperature-controlling fluid. In this case, as shown in FIG. 2, the surface of the caterpillar module 150 may be also heated or cooled by being engaged with, and thermally connected to, the second rotating body 120 of the first temperature controller 100. In addition, the caterpillar module 150, which may be heated or cooled, may be thermally connected to the polishing pad 15 in contact with the polishing pad (15 in FIG. 2) while rotating, whereby the polishing pad 15 may be heated or cooled by thermal conduction.

In addition, the second rotating body 120 may be connected to the fluid supplier 170 through a second discharge unit 126. According to some embodiments, the second rotating body 120 may discharge the temperature-controlling fluid to the fluid supplier 170 through the second discharge unit 126. That is, the second rotating body 120 may control the temperature by using the temperature-controlling fluid during the chemical mechanical polishing process and discharge the temperature-controlling fluid back to the fluid supplier 170. The first temperature controller 100 may include the fluid supplier 170, the second supply unit 125, the second rotating body 120 and the second discharge unit 126. The fluid supplier 170, the second supply unit 125, the second rotating body 120 and the second discharge unit 126 may form a second temperature-controlling fluid circuit, which may transfer heat to or from the caterpillar module 150 and the polishing pad 15.

Referring to FIG. 2 and FIG. 6, the first heat transfer module 130 may be connected to the fluid supplier 170 through a third supply unit 135. According to some embodiments, the fluid supplier 170 may supply the temperature-controlling fluid to the first heat transfer module 130 through the third supply unit 135. The first heat transfer module 130 may be heated or cooled by being supplied with the temperature-controlling fluid. In this case, the surface of the caterpillar module (150 in FIG. 3) surrounded by the first heat transfer module 130 may be also heated or cooled. In addition, the caterpillar module 150, which may be heated or cooled, may be thermally connected to the polishing pad 15 in contact with the polishing pad (15 in FIG. 2) while rotating, whereby the polishing pad 15 may be heated or cooled by thermal conduction.

In addition, the first heat transfer module 130 may be connected to the fluid supplier 170 through a third discharge unit 136. According to some embodiments, the first heat transfer module 130 may discharge the temperature-controlling fluid to the fluid supplier 170 through the third discharge unit 136. That is, the first heat transfer module 130 may control the temperature by using the temperature-controlling fluid during the chemical mechanical polishing process and discharge the temperature-controlling fluid back to the fluid supplier 170. The first temperature controller 100 may include the fluid supplier 170, the third supply unit 135, first heat transfer module 130 and the third discharge unit 136. The fluid supplier 170, the third supply unit 135, first heat transfer module 130 and the third discharge unit 136 may form a third temperature-controlling fluid circuit, which may transfer heat to or from the caterpillar module 150 and the polishing pad 15.

The second heat transfer module 140 may be connected to the fluid supplier 170 through a fourth supply unit 145. According to some embodiments, the fluid supplier 170 may supply the temperature-controlling fluid to the second heat transfer module 140 through the fourth supply unit 145. The second heat transfer module 140 may be heated or cooled by being supplied with the temperature-controlling fluid. In this case, the surface of the caterpillar module (150 in FIG. 4) surrounded by the second heat transfer module 140 may be also heated or cooled. In addition, the caterpillar module 150, which may be heated or cooled, may be thermally connected to the polishing pad 15 in contact with the polishing pad (15 in FIG. 2) while rotating, whereby the polishing pad 15 may be heated or cooled by thermal conduction.

In addition, the second heat transfer module 140 may be connected to the fluid supplier 170 through a fourth discharge unit 146. According to some embodiments, the second heat transfer module 140 may discharge the temperature-controlling fluid to the fluid supplier 170 through the fourth discharge unit 146. That is, the second heat transfer module 140 may control the temperature by using the temperature-controlling fluid during the chemical mechanical polishing process and discharge the temperature-controlling fluid back to the fluid supplier 170. The first temperature controller 100 may include the fluid supplier 170, the fourth supply unit 145, the second heat transfer module 140 and the fourth discharge unit 146. The fluid supplier 170, the fourth supply unit 145, the second heat transfer module 140 and the fourth discharge unit 146 may form a fourth temperature-controlling fluid circuit, which may transfer heat to or from the caterpillar module 150 and the polishing pad 15.

The surface of the caterpillar module 150 may receive the temperature-controlling fluid from the fluid supplier 170, which may affect the temperature of the surface of the caterpillar module 150. Although not shown, the first temperature controller 100 may include a sensor unit, which may measure the temperature of the surface of the caterpillar module 150.

Figure 7:
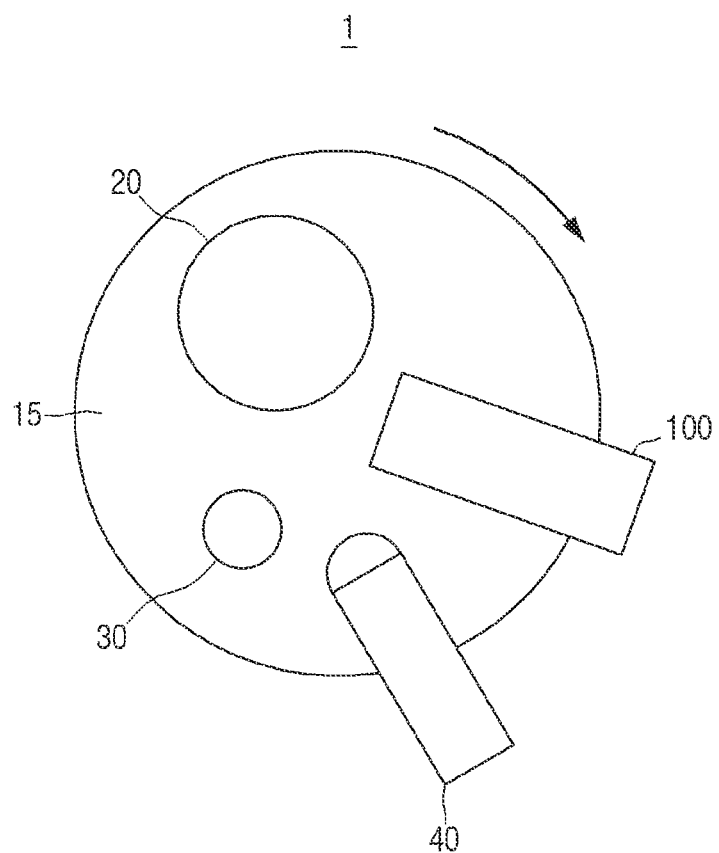
FIG. 7 is a plan view illustrating an operation of a substrate processing device according to some embodiments.
Figure 8:
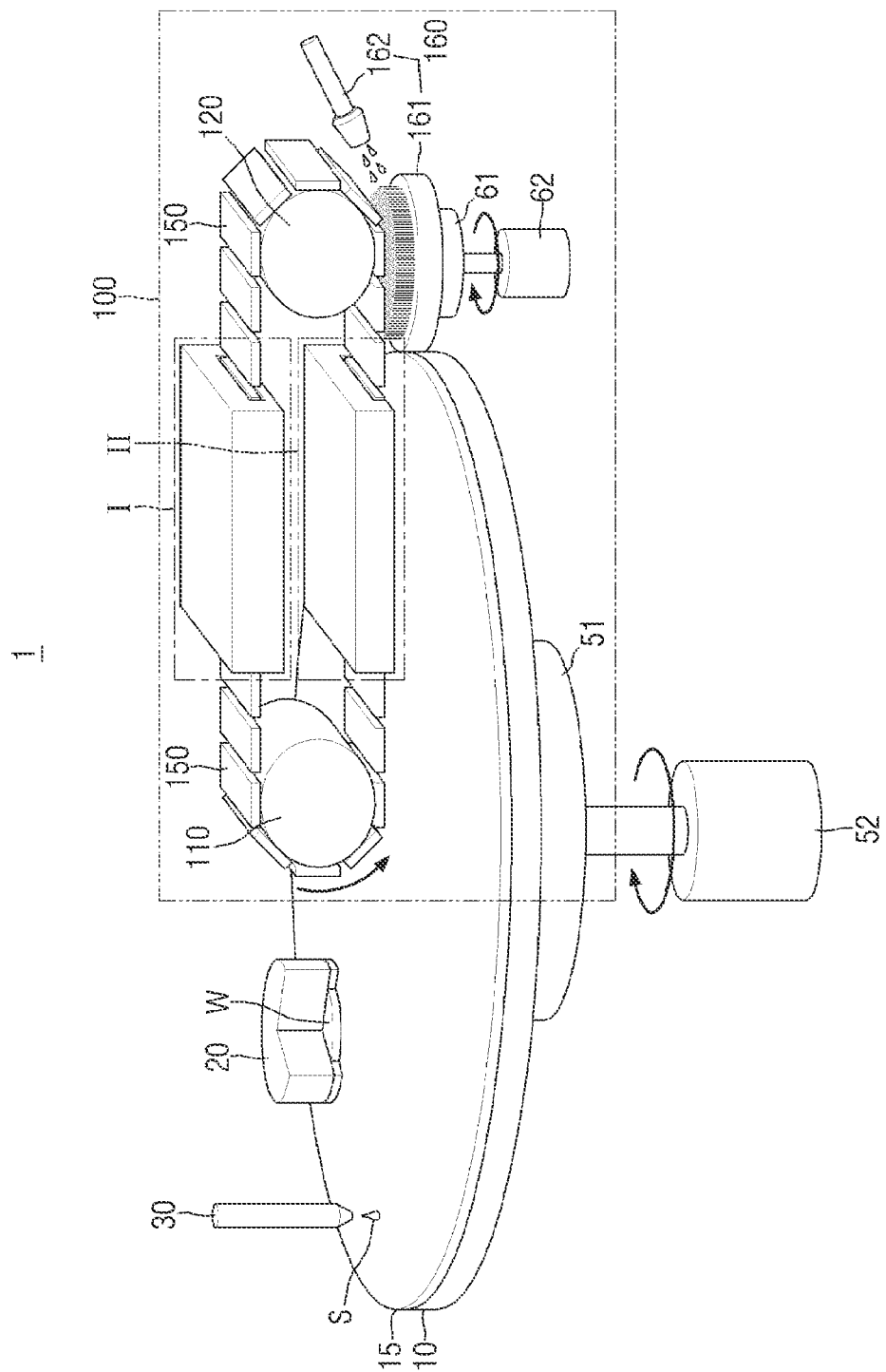
FIG. 8 is a side view illustrating an operation of a substrate processing device according to some embodiments.

FIG. 7 is a plan view illustrating an operation of a substrate processing device according to some embodiments. FIG. 8 is a side view illustrating an operation of a substrate processing device according to some embodiments.

Referring to FIG. 7 and FIG. 8, in the substrate processing device 1, the first driving shaft 51 may be connected to the lower portion of the platen 10, and the first driving shaft 51 may rotate the polishing pad 15 disposed on the platen 10 by receiving the rotational power from the first motor 52. While the chemical mechanical polishing process is being performed, the polishing pad 15, which may be rotating, may polish the wafer W provided by the carrier head 20.

Depending on a temperature of the temperature-controlling fluid, the first temperature controller 100 may transfer heat to or from the polishing pad (15 in FIG. 2) while the chemical mechanical polishing process is being performed. For example, the first rotating body 110, the second rotating body 120, the first heat transfer module (130 in FIG. 3) and the second heat transfer module (140 in FIG. 4) of the first temperature controller 100 may transfer heat to the caterpillar module 150. The caterpillar module 150, which may be heated, may rotate in a first direction by being engaged with the first rotating body 110 and the second rotating body 120, and in this case, the caterpillar module 150 may transfer heat to the polishing pad (15 in FIG. 2), which may be rotating in a second direction. In some embodiments, the caterpillar module 150 of the first temperature controller 100 may rotate in the first direction, which may be perpendicular to a rotation of the polishing pad 15 in the second direction, as shown in FIG. 8.

The second driving shaft 61 may be connected to the lower portion of the brush unit 161 of the cleaning module 160. The second driving shaft 61 may rotate the brush unit 161 as shown in FIG. 8 by receiving the rotational power from the second motor 62. The second driving shaft 61 may be parallel to the first driving shaft 51. The second driving shaft 61 may rotate in the second direction, which may be a same direction as the first driving shaft 51 as shown in FIG. 8. The second driving shaft 61 may rotate in an opposite direction to the first driving shaft 51. Meanwhile, the caterpillar module 150 may transfer contaminants to the brush unit 161 while rotating in the first direction. The contaminants may be removed from the brush unit 161 by a spray unit 162. The spray unit 162 may spray a cleaning solution onto the brush unit 161, which may be rotating to efficiently remove the contaminants.

Figure 9:
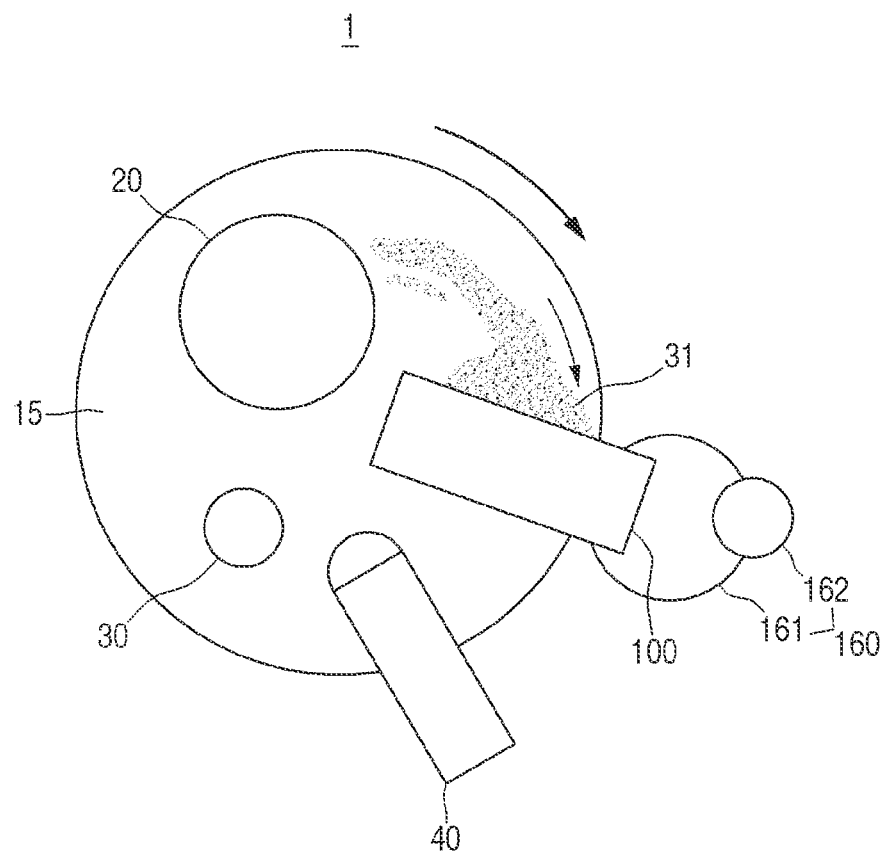
FIG. 9 is a plan view illustrating an effect of a substrate processing device according to some embodiments.

FIG. 9 is a plan view illustrating an effect of a substrate processing device according to some embodiments.

Referring to FIG. 2 and FIG. 9, the substrate processing device 1, which may include the first temperature controller 100 and the cleaning module 160, may minimize a contamination level of the first temperature controller 100 while the chemical mechanical polishing process is being performed. For example, as shown in FIG. 9, contaminants 31 (e.g., waste slurry, pad debris, polishing process byproducts, etc.) that may be generated by the chemical mechanical polishing process may move in the direction of the polishing pad 15 and toward a side of the first temperature controller 100. The first temperature controller (100 in FIG. 2) may be a caterpillar-type first temperature controller temperature controller that may have a rotational motion, and the contaminants 31 moved to the surface of the caterpillar module 150 may be removed by the cleaning module 160. The contaminants may be removed from the surface of the caterpillar module 150 by the cleaning module 160 before the contaminants have solidified. Also, as shown in FIG. 9, a portion of the first temperature controller (100 in FIG. 9) may extend beyond an edge of the polishing pad 15, and the cleaning module 160 may be disposed below a portion of the first temperature controller 100 exposed outside the polishing pad 15, so that a cleaning operation may be performed while the chemical mechanical polishing process is being performed. Therefore, the substrate processing device 1, which includes the first temperature controller 100 and the cleaning module 160, may perform a cleaning operation for cleaning the first temperature controller 100 while the chemical mechanical polishing process is being performed. In some embodiments, since the first temperature controller 100 may be continuously cleaned during the chemical mechanical polishing process, a contamination level of the first temperature controller 100 at any given time may be low.

Figure 10:
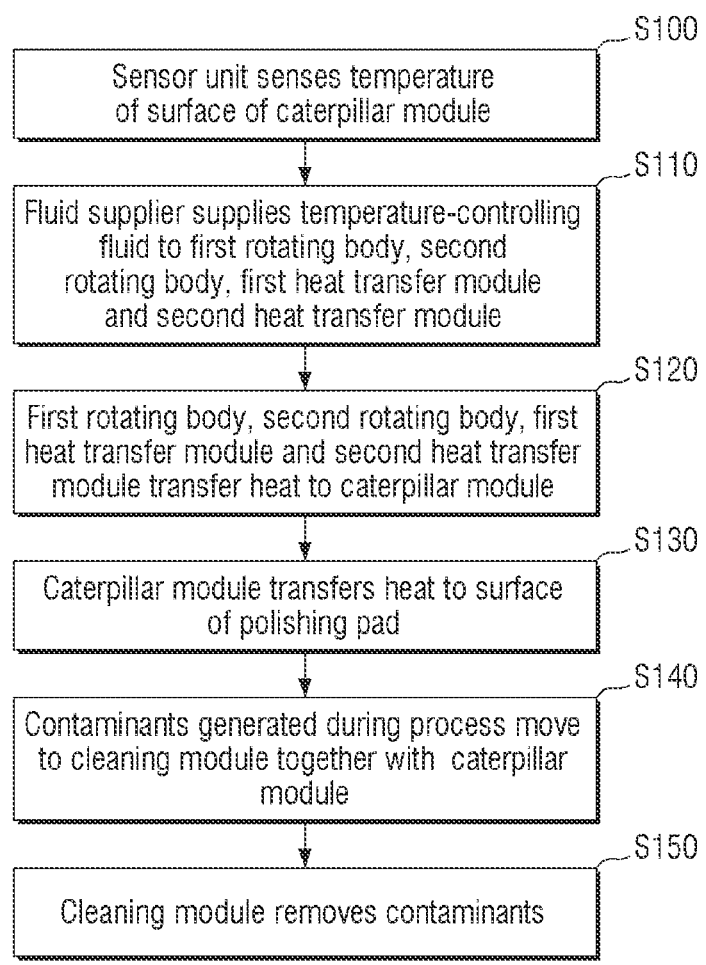
FIG. 10 is a flow chart illustrating a method for operating a substrate processing device according to some embodiments.

FIG. 10 is a flow chart illustrating a method for operating a substrate processing device according to some embodiments.

Referring to FIG. 1, FIG. 2, FIG. 3, FIG. 4, FIG. 5, FIG. 6, FIG. 7, FIG. 8, FIG. 9, and FIG. 10, in order to control a polishing temperature while a chemical mechanical polishing process is being performed, a temperature of the caterpillar module 150 may be sensed (S100). For example, a sensor unit of the caterpillar module 150 may sense the temperature of a surface of the caterpillar module 510.

The fluid supplier 170 may supply the temperature-controlling fluid (e.g., heated fluid or cooled fluid) to the first rotating body 110, the second rotating body 120, the first heat transfer module 130 and the second heat transfer module 140 (S110). The fluid supplier 170 may supply the temperature-controlling fluid based on the measured temperature of the surface of the caterpillar module 150. The first rotating body 110, the second rotating body 120, the first heat transfer module 130 and the second heat transfer module 140 may be supplied with the temperature-controlling fluid supplied from the fluid supplier 170, which may heat or cool the surface of the caterpillar module 150.

As shown in FIG. 2, FIG. 3, and FIG. 4, the first rotating body 110, the second rotating body 120, the first heat transfer module 130 and the second heat transfer module 140 may transfer heat to (or from) the caterpillar module 150 (S120). The first rotating body 110, the second rotating body 120, the first heat transfer module 130 and the second heat transfer module 140 may be in contact with the caterpillar module 150, which may enable thermal conduction.

The caterpillar module 150 may transfer heat to the surface of the polishing pad 15, which may be disposed on the platen 10 (S130). The caterpillar module 150 may transfer heat to the surface of the polishing pad 15 while the polishing pad 15 is rotated by the platen 10.

In addition, contaminants 31 generated by the chemical mechanical polishing process may be moved toward the side of the first temperature controller 100 by the rotation of the polishing pad as shown in FIG. 9. At this time, the contaminants 31 that have been moved to the first temperature controller 100 may be moved to the cleaning module 160 by the caterpillar module 150 while the caterpillar module 150 of the first temperature controller 100 is being rotated (S140).

The contaminants 31 that have moved to the cleaning module 160 by the caterpillar module 150 may be removed from the cleaning module 160 (S150). The contaminants 31 may be continuously and sequentially removed from the polishing pad 15 by the caterpillar module 150, moved to the cleaning module 160 by the caterpillar module 150, and may be removed from the cleaning module 160.

Figure 11:
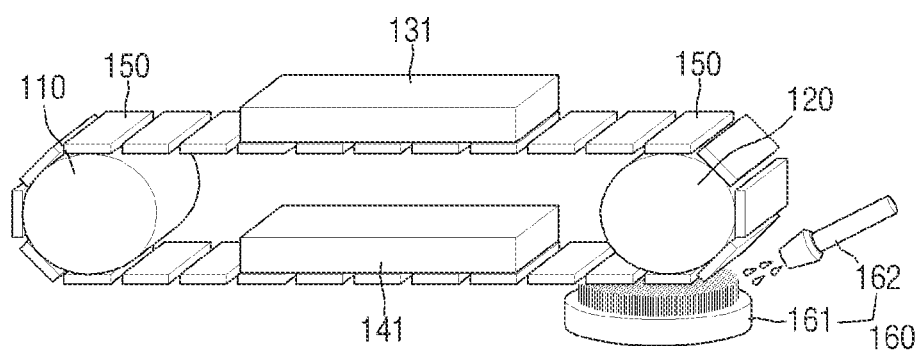
FIG. 11 is a side view illustrating a second temperature controller according to some embodiments.
Figure 12:
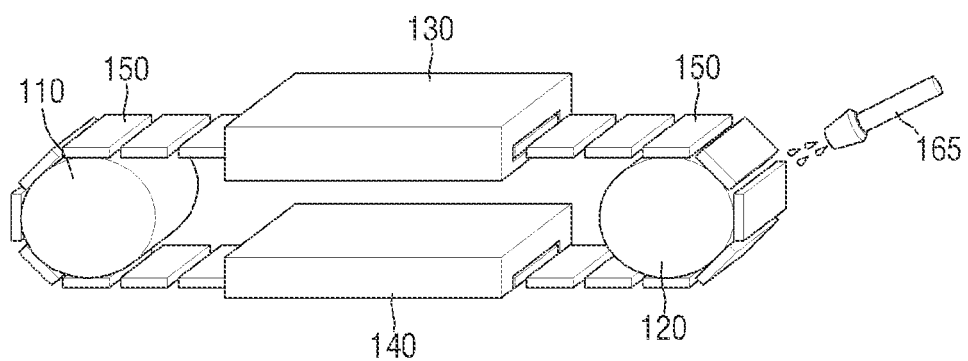
FIG. 12 is a side view illustrating a third temperature controller according to some embodiments.
Figure 13:
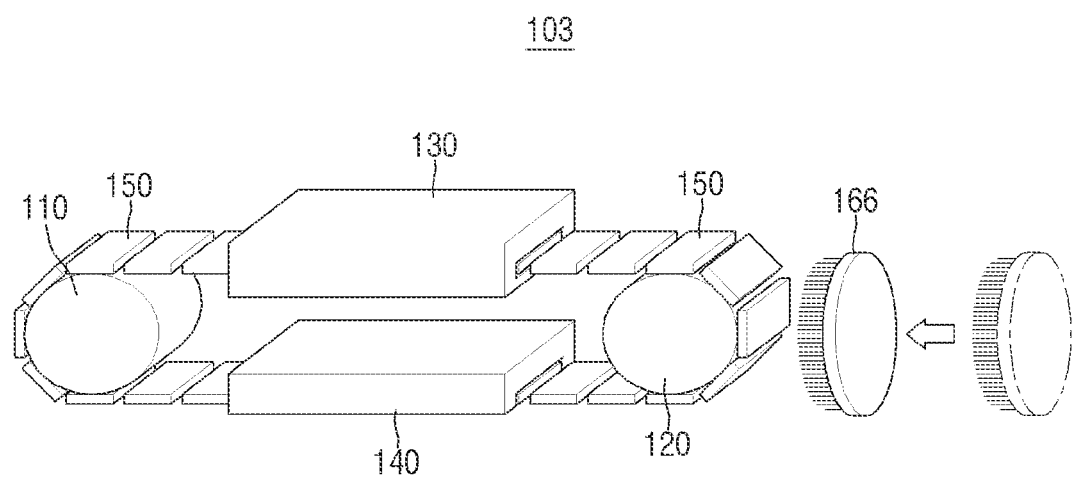
FIG. 13 is a side view illustrating a fourth temperature controller according to some embodiments.

FIG. 11 is a side view illustrating a second temperature controller according to some embodiments. FIG. 12 is a side view illustrating a third temperature controller according to some embodiments. FIG. 13 is a side view illustrating a fourth temperature controller according to some embodiments. For convenience of description, redundant portions of those described with reference to FIG. 1 to FIG. 10 may be briefly described or omitted.

Referring to FIG. 11, a second temperature controller 101 may include a first heat transfer module 131 and a second heat transfer module 141.

In some embodiments, the first heat transfer module 131 may be disposed on the caterpillar module 150 as shown in FIG. 11. The first heat transfer module 131 may be disposed on a surface of the caterpillar module 150. The first heat transfer module 131 may be disposed on an outer surface of the caterpillar module 150. The first heat transfer module 131 may have a first contact area with the caterpillar module 150. In some embodiments, the second heat transfer module 141 may be disposed on a surface of the caterpillar module 150. The second heat transfer module 141 may be disposed on an inner surface of the caterpillar module 150. The second heat transfer module 141 may have a second contact area with the caterpillar module 150.

The second temperature controller (101 in FIG. 11) may reduce contact areas between the first heat transfer module 131 and the caterpillar module 150, and between the second heat transfer module 141 and the caterpillar module 150. The second temperature controller (101 in FIG. 11) may reduce friction between the first heat transfer module 131 and the caterpillar module 150, and between the second heat transfer module 141 and the caterpillar module 150. Therefore, damage to, or ware of, the caterpillar module 150, which is caused by abrasion, may be reduced.

The second temperature controller 101 in FIG. 11 may reduce the contact area between the heat transfer module and the caterpillar module 150, which may reduce heat transfer efficiency to the polishing pad (15 in FIG. 2). The second temperature controller 101 in FIG. 11 may reduce abrasion, whereby the second temperature controller 101 may be efficient in view of lifespan extension of the caterpillar module 150.

Referring to FIG. 12, a third temperature controller 102 may include a spray type cleaning module 165.

In some embodiments, the spray type cleaning module 165 may be disposed adjacent to the caterpillar module 150. The spray type cleaning module 165 may spray a fluid onto the caterpillar module 150. The spray type cleaning module 165 may spray the fluid onto the caterpillar module 150 to clean the caterpillar module 150. For example, the fluid sprayed by the spray type cleaning module 165 may be a mixture of $N_2$ and DI water, but is not limited thereto.

In some embodiments, the spray type cleaning module 165 may transfer heat to, or remove heat from, the third temperature controller 102. The spray type cleaning module 165 may directly spray a heated fluid or a cooled fluid onto the caterpillar module 150. The spray type cleaning module 165 of the third temperature controller 102 may be used for cleaning and temperature control. The spray type cleaning module 165 of the third temperature controller 102 may be used for simultaneous cleaning and temperature control.

Referring to FIG. 13, a fourth temperature controller 103 may include a brush-type cleaning module 166.

In some embodiments, the brush-type cleaning module 166 may be disposed adjacent to the caterpillar module 150. As shown in FIG. 13, the brush-type cleaning module 166 may clean the caterpillar module 150 while moving toward the caterpillar module 150 from the side of the caterpillar module 150. The brush-type cleaning module 166 of the fourth temperature controller 103 cleans the caterpillar module 150 with a physical force. Since the brush-type cleaning module 166 of the fourth temperature controller 103 cleans the caterpillar module 150 with a physical force, damage to, or wear of, the caterpillar module 150 caused by abrasion may be reduced. According to some embodiments, the fourth temperature controller 103 may be efficient in view of a lifespan extension of the caterpillar module 150.

Figure 14:
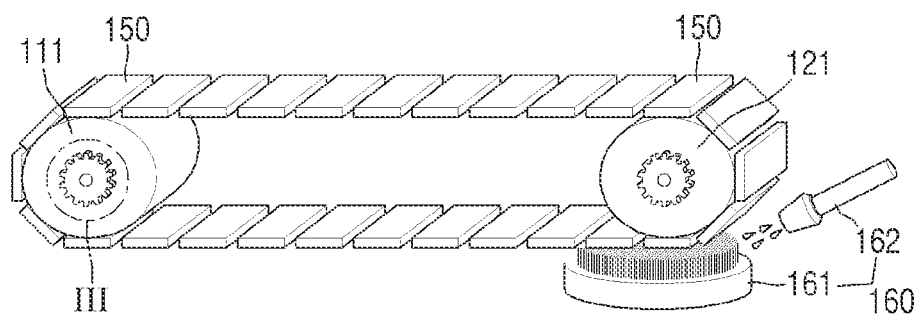
FIG. 14 is a side view illustrating a fifth temperature controller according to some embodiments.
Figure 15:
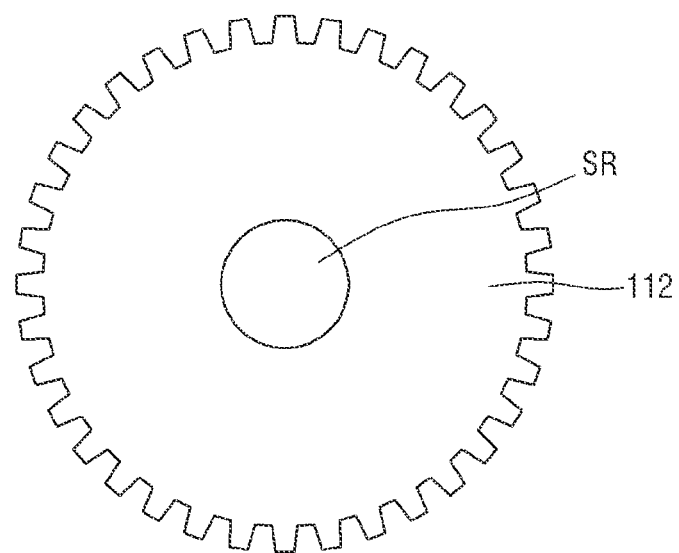
FIG. 15 is an enlarged view illustrating a third region III of FIG. 14.
Figure 16:
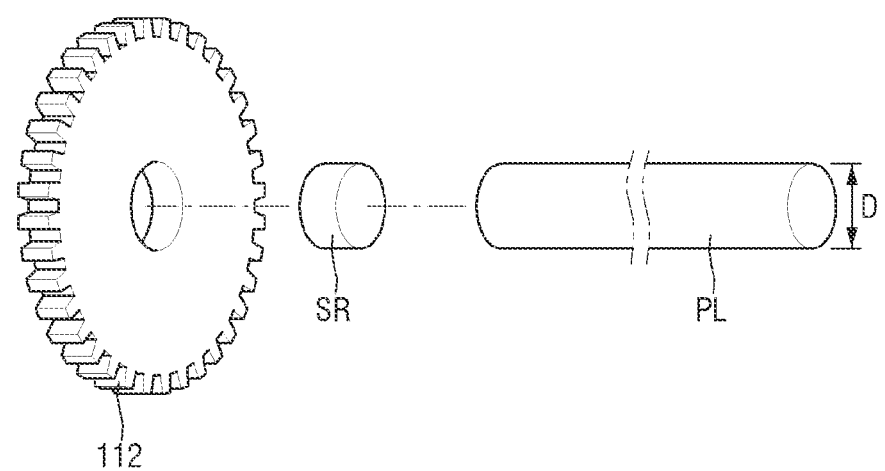
FIG. 16 is a view illustrating a third region III of FIG. 14 according to some embodiments.
Figure 17:
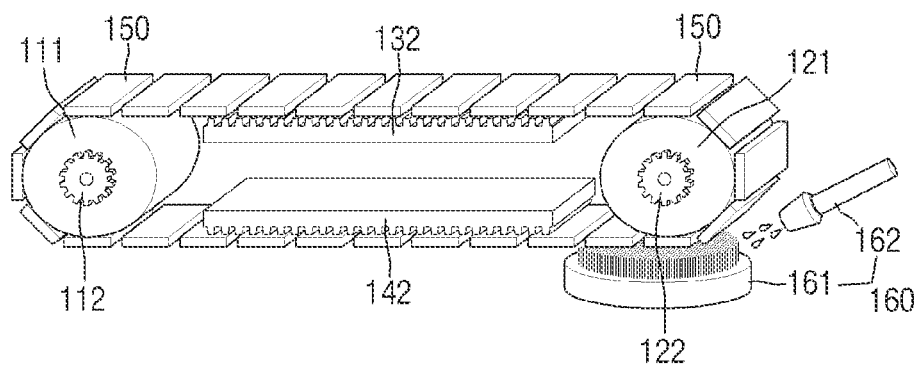
FIG. 17 is a side view illustrating a sixth temperature controller according to some embodiments.

FIG. 14 is a side view illustrating a fifth temperature controller according to some embodiments. FIG. 15 is an enlarged view illustrating a third region III of FIG. 14. FIG. 16 is a view illustrating a third region III of FIG. 14 according to some embodiments. FIG. 17 is a side view illustrating a sixth temperature controller according to some embodiments. For convenience of description, redundant portions of those described with reference to FIG. 1 to FIG. 13 may be briefly described or omitted.

Referring to FIG. 14, a fifth temperature controller 104 may include a third rotating body 111 and a fourth rotating body 121.

As shown in FIG. 14, the caterpillar module 150 may rotate while being engaged with the third rotating body 111 and the fourth rotating body 121. The caterpillar module 150 may be driven by rotation of at least one of the third rotating body 111 or the fourth rotating body 121. In some embodiments, both the third rotating body 111 and the fourth rotating body 121 may include a third region III. Hereinafter, the third region III will be described in connection with the third rotating body 111 as a representative example.

In some embodiments, the fifth temperature controller 104 may not include a heat transfer module.

Referring to FIG. 15 and FIG. 16, a third region III of FIG. 14 may be a region that includes a first Peltier cell 112 and a slip ring SR.

As shown in FIG. 16, the slip ring SR of the third region III may be connected to a power line PL. The slip ring SR may receive power from the power line PL. The slip ring SR may conduct the power to the first Peltier cell 112. In some embodiments, the slip ring SR may be disposed at a central portion of the first Peltier cell 112. The slip ring SR may uniformly conduct the power to the first Peltier cell 112. Also, in some embodiments, the slip ring SR and the power line PL may have the same diameter D. The slip ring SR may have a diameter that fits within a hole at a central portion of the first Peltier cell 112.

The first Peltier cell 112 may be an element used to convert electrical energy into thermal energy. For example, the first Peltier cell 112 may convert the power supplied from the slip ring SR into thermal energy and transfer the thermal energy to the third rotating body 111. In some embodiments, the first Peltier cell 112 may be positioned at a central portion of the third rotating body 111 to uniformly transfer heat to the third rotating body 111.

The third rotating body 111 and the fourth rotating body 121 may transfer heat to the caterpillar module 150 while rotating in engagement with the caterpillar module 150 as shown in FIG. 14. The caterpillar module 150 may be in contact with the polishing pad (15 in FIG. 2) in the same manner as the first temperature controller (100 in FIG. 2). The caterpillar module 150 may transfer heat to the polishing pad (15 in FIG. 2).

According to some embodiments, the fifth temperature controller 104 may use a Peltier cell (e.g., the first Peltier cell 112) for generating heat without receiving a temperature-controlling fluid when transferring heat to the caterpillar module 150.

Referring to FIG. 17, the sixth temperature controller 105 may include the third rotating body 111 including the first Peltier cell 112, the fourth rotating body 121 including a second Peltier cell 122, a third Peltier cell 132 and a fourth Peltier cell 142.

The sixth temperature controller 105 may include the third Peltier cell 132 and the fourth Peltier cell 142, which may be mounted on the caterpillar module 150, as shown in FIG. 17. The third Peltier cell 132 and the fourth Peltier cell 142 may be mounted on an inner surface of the caterpillar module 150, Although not shown, the third Peltier cell 132 and the fourth Peltier cell 142 may be connected to the slip ring SR and the power line PL to receive power from a power source, and may generate thermal energy based on the received power. The third Peltier cell 132 and the fourth Peltier cell 142 may transfer heat to the caterpillar module 150. Therefore, as the sixth temperature controller 105 further includes the third Peltier cell 132 and the fourth Peltier cell 142, a route for transferring heat to the caterpillar module 150 is established, whereby efficiency in transferring heat may be improved.

Although embodiments of the present disclosure have been described with reference to the accompanying drawings, the present disclosure is not limited to described embodiments and can be manufactured in various forms. Those skilled in the art will appreciate that the present invention may be embodied in other specific forms without departing from the technical spirits and essential characteristics. Thus, described embodiments are to be considered in all respects as illustrative and not restrictive.

The invention claimed is:

1. A substrate processing device comprising:
   a platen;
   a polishing pad disposed on the platen;
   a first rotating body;
   a second rotating body spaced apart from the first rotating body; and
   a caterpillar module disposed on a portion of the polishing pad, engaged with the first rotating body and the second rotating body, and extending outside of an outer circumferential surface of the platen.

2. The substrate processing device of claim 1, further comprising a temperature controller thermally connected to the caterpillar module.

3. The substrate processing device of claim 1, wherein the polishing pad is configured to rotate in a first direction and the caterpillar module is configured to rotate in a second direction, perpendicular to the first direction.

4. A substrate processing device comprising:
   a platen;
   a polishing pad disposed on the platen;
   a first rotating body;
   a second rotating body spaced apart from the first rotating body;
   a caterpillar module disposed on a portion of the polishing pad and engaged with the first rotating body and the second rotating body; and
   a temperature controller thermally connected to the caterpillar module.

5. The substrate processing device of claim 4,
   wherein the first rotating body is supplied with a first temperature-controlling fluid, and
   the caterpillar module is thermally connected to the first rotating body.

6. The substrate processing device of claim 4,
   wherein the second rotating body is supplied with a second temperature-controlling fluid, and
   the caterpillar module is thermally connected to the second rotating body.

7. The substrate processing device of claim 4,
   wherein the temperature controller comprises a heat transfer module disposed between the first rotating body and the second rotating body, providing heat to the caterpillar module.

8. The substrate processing device of claim 7,
   wherein the heat transfer module comprises:
   a first heat transfer module surrounding a first portion of the caterpillar module between the first rotating body and the second rotating body; and
   a second heat transfer module spaced apart from the first heat transfer module and surrounding a second portion of the caterpillar module disposed on the polishing pad.

9. The substrate processing device of claim 8,
   wherein the second portion of the caterpillar module is disposed between the second heat transfer module and the polishing pad, and the second heat transfer module surrounds sides of the second portion of the caterpillar module.

10. The substrate processing device of claim 4,
    wherein the second rotating body is disposed outside of an outer circumferential surface of the platen.

11. The substrate processing device of claim 4, further comprising:
    a cleaning module disposed on an outer circumferential surface of the platen and disposed in contact with the caterpillar module.

12. The substrate processing device of claim 11,
    wherein the cleaning module comprises a spray unit spraying a cleaning fluid to a surface of the caterpillar module.

13. The substrate processing device of claim 11,
    wherein the cleaning module comprises a brush unit disposed in contact with the caterpillar module and connected to a driving shaft for rotating the brush unit.

14. The substrate processing device of claim 4, wherein temperature controller comprises:
- a first Peltier cell thermally connected to the first rotating body; and
- a second Peltier cell thermally connected to the second rotating body.

15. The substrate processing device of claim 14,
wherein a temperature of the first rotating body is controlled by the first Peltier cell, and
the caterpillar module is thermally connected to the first rotating body, and
wherein a temperature of the second rotating body is controlled by the second Peltier cell, and the caterpillar module is thermally connected to the second rotating body.

16. The substrate processing device of claim 15,
wherein the first Peltier cell includes a first slip ring connected to a power line supplying electrical energy, and the first Peltier cell converts the electrical energy into thermal energy to control the temperature of the first rotating body, and
wherein the second Peltier cell includes a second slip ring connected to a power line supplying electrical energy, and the second Peltier cell converts the electrical energy into thermal energy to control the temperature of the second rotating body.

17. A method for operating a substrate processing device comprising a platen, a polishing pad disposed on the platen, a first rotating body, a second rotating body spaced apart from the first rotating body, and a caterpillar module disposed on a portion of the polishing pad and engaged with the first rotating body and the second rotating body, the method comprising:
- rotating first rotating body and the second rotating body to rotate the caterpillar module;
- rotating the polishing pad;
- transferring heat to the caterpillar module; and
- transferring heat to a surface of the polishing pad by the caterpillar module.

18. The method of claim 17,
wherein transferring heat to the caterpillar module includes supplying, by a heat transfer module disposed between the first rotating body and the second rotating body, heat to the caterpillar module.

19. The method of claim 17, further comprising:
cleaning the caterpillar module using a cleaning module disposed on an outer circumferential surface of the platen and disposed below the caterpillar module.

20. The method of claim 19, further comprising:
- moving contaminants on the polishing pad to the caterpillar module by the rotation of the polishing pad;
- moving the contaminants to the cleaning module by the rotation of the caterpillar module; and
- removing the contaminants from the caterpillar module by the cleaning module.

* * * * *